(12) United States Patent
Uchida

(10) Patent No.: US 6,396,337 B1
(45) Date of Patent: May 28, 2002

(54) TRANSISTOR CIRCUIT WITH DIRECT-COUPLED STAGES

(75) Inventor: Jun Uchida, Shizuoka (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/404,509

(22) Filed: Sep. 23, 1999

(30) Foreign Application Priority Data

Sep. 24, 1998 (JP) .......................................... 10-269337

(51) Int. Cl.[7] .............................. G06G 7/12; G06G 7/26
(52) U.S. Cl. ........................ 327/560; 327/112; 327/333
(58) Field of Search ............................... 327/112, 333, 327/482, 489, 560, 52

(56) References Cited

U.S. PATENT DOCUMENTS

| 4,686,395 | A | * | 8/1987 | Sata et al. ..................... 326/32 |
| 4,877,975 | A | * | 10/1989 | Ueno ........................... 326/23 |
| 5,065,055 | A | * | 11/1991 | Reed ............................ 327/52 |
| 5,999,044 | A | * | 12/1999 | Wohlfarth et al. .......... 327/563 |

FOREIGN PATENT DOCUMENTS

| JP | 51-11346 | 1/1976 |
| JP | 52-45243 | 4/1977 |
| JP | 52-144948 | 12/1977 |
| JP | 60-66509 | 4/1985 |
| JP | 60-23523 | 6/1985 |
| JP | 62-72231 | 4/1987 |
| JP | 7-307628 | 11/1995 |

* cited by examiner

*Primary Examiner*—Toan Tran
*Assistant Examiner*—Quan Tra
(74) *Attorney, Agent, or Firm*—Scully, Scott, Murphy & Presser

(57) ABSTRACT

A transistor circuit that ensures signal transmission between adjoining direct-coupled stages at a low supply voltage even when an input signal is in a high level. This transistor circuit is comprised of a first stage having a first transistor and a first load connected to a collector or drain of the first transistor, and a second stage having a second transistor. An input voltage is applied to a base or gate of the first transistor in the first stage. The first transistor produces a first output current flowing through the first load according to the input voltage, thereby outputting a first output voltage at the collector or drain of the first transistor The first output voltage from the first stage is applied to a base or gate of the second transistor in the second stage without using any coupling capacitor. The first load has a variable resistance responsive to a magnitude of a dc component of the first output current. When the magnitude of the dc component of the first output current is increased from a predetermined value due to a magnitude increase of the input voltage, thereby decreasing a magnitude of a dc component of the first output voltage, the variable resistance of the first load is decreased so as to compensate the decreased magnitude of the dc component of the first output voltage. The effect caused by the operating point shift is compensated.

20 Claims, 10 Drawing Sheets

TRANSISTOR CIRCUIT WITH DIRECT-COUPLED STAGES

BACKGROUND OF THE INVENTION

1. Field of the Invention

The present invention relates to a transistor circuit and more particularly, to a transistor circuit equipped with direct-coupled stages that compensates the effect caused by the shift of the operating point of a transistor or transistors due to high-level input, which is preferably applied to radio communication systems such as portable or mobile telephones operable at a low supply voltage of approximately 1 V.

2. Description of the Prior Art

In recent years, to downsize radio communication systems such as mobile telephones, more and more Integrated Circuits (ICs) have been incorporated into the systems. Under the circumstances, the ICs need to be formed as small as possible, because the chip size of the ICs affects directly the size of the systems.

As known well, generally, the chip area of a capacitor is comparatively large with respect to other electronic elements such as a resistor and a transistor and at the same time, it increases proportionally with the increasing capacitance value. This means that capacitors form a bottleneck in decreasing the chip size of ICs.

Discrete capacitor components may be prepared outside ICs and connected to the ICs, reducing the number of capacitors in ICs. In this case, however, there arises a disadvantage that discrete capacitor components increase the overall mounting area of parts or subsystems of radio communication systems, which is contrary to the downsizing of radio communication systems. Accordingly, it is necessary that the number itself of capacitors in the systems is reduced.

As a result, to reduce the number itself of capacitors in the ICs designed for the radio communication systems of this sort, the direct-coupling configuration has been usually used to interconnect adjoining stages of transistor circuits such as amplifiers, frequency mixers, and so on in the ICs.

FIG. 1 shows the circuit configuration of a prior-art transistor amplifier circuit incorporated into an IC for a mobile telephone. In FIG. 1, the input of the prior-art transistor amplifier circuit 100 is connected to an antenna 101 through a tuning circuit 102 and the output thereof is connected to the input of a demodulator 105. The output of the demodulator 10; is connected to the input of a data processor 106. The output of the data processor 106 is connected to the input of a reception indicator 107.

The antenna 101 receives radio wave including transmitted Radio frequency (RF) signals. The tuning circuit 102 selects a desired one of the RF signals thus received by the antenna 101 and outputs the desired, selected RF signal to the amplifier circuit 100. The RP signal thus inputted into the amplifier circuit 100 is referred as an input voltage $V_{IN}$.

The amplifier circuit 100 amplifies the input voltage $V_{IN}$ and outputs an amplified RF signal to the demodulator 105. The amplified RF signal thus outputted from the amplifier circuit 100 is referred as an output voltage $V_{OUT}$.

The demodulator 105 demodulates the RE signal (i.e., the output voltage $V_{OUT}$) outputted from the amplifier circuit 100 and outputs a demodulated signal to the data processor 106. The data processor 106 performs predetermined data processing operations with respect to the demodulated signal. If the identification number (ID No.) included in the demodulated signal accords with the ID No. of the user or holder, the data processor 106 sends a specific signal to the reception indicator 107, notifying the user of the reception of communications or messages. Thereafter, the user accesses the received communications or messages as necessary.

As seen from FIG. 1, the prior-art amplifier circuit 100 has two amplifier stages 103 and 104 directly-coupled together without using any coupling capacitors.

The first amplifier stage 103 has an npn-type bipolar transistor TR101 whose emitter is connected to the ground and a load resistor R101 (resistance: $R_L$) connected to the collector of the transistor TR101. The input voltage $V_{IN}$ from the tuning circuit 102 is applied to the base of the transistor TR101. The collector of the transistor TR101 is connected through the load resistor R101 to a power supply and is applied with a constant supply voltage $V_{CC}$. Here, $V_{CC}$=1 V. An amplified voltage of $V_{IN}$, i.e, an output voltage $V_1$ of the first amplifier stage 103, is derived from the collector of the transistor TR101.

The second amplifier stage 104 has an npn-type bipolar transistor TR102 whose emitter is connected to the ground and a load resistor R104 connected to the collector of the transistor TR102. The output voltage $V_1$ of the first amplifier stage 103 is applied to the base of the transistor TR102 through a coupling resistor R103. The collector of the transistor TR102 is connected through the load resistor R104 to the power supply of $V_{CC}$ and is applied with the constant supply voltage $V_{CC}$. An amplified voltage of $V_1$, i.e., the output voltage $V_{OUT}$ of the second amplifier stage 104, is derived from the collector of the transistor TR102 and is applied to the demodulator 105.

The strength of the transmitted radio wave fluctuates in the air due to the change of the propagation and/or reflection conditions. If the antenna 101 is located in a place where the strength of the radio wave is in a high level, the input level for the first amplifier stage 103 of the amplifier circuit 100 (i.e., the input voltage $V_{IN}$, to the first amplifier stage 103) has a large magnitude. Obviously, due to the amplification operation in the first amplifier stage 103, the output voltage $V_{OUT}$ of the amplifier circuit 100 has a larger magnitude than that of the input voltage $V_{IN}$. This means that the output voltage $V_{OUT}$ of the amplifier circuit 100 has an enough magnitude for receiving the transmitted communications or messages. In spite of this fact, there is a possibility that the telephone shown in FIG. 1 is unable to perform its reception operation, the reason of which is as follows.

Here, as shown in FIG. 1, the base-to-emitter voltage, the collector-to-emitter voltage, the base current, and the collector current of the transistor TR101 are defined as $V_{BE101}$, $V_{CE101}$, $I_{B101}$, and $I_{C101}$, respectively. Similarly, the base-to-emitter voltage, the collector-to-emitter voltage, the base current, and the collector current of the transistor TR102 are defined as $V_{BE102}$, $V_{CE102}$, $I_{B102}$, and $I_{C102}$, respectively.

The input voltage $V_{IN}$ is expressed as the sum of the bias (dc) component $V_{BB}$ and the signal (ac) component $V_{IN}$. Then, the base-to-emitter voltage $V_{BE101}$ is equal to the input voltage $V_{IN}$ and therefore, the following equation (1) is established.

$$V_{IN}=V_{BE101}=V_{BB}+V_{IN} \tag{1}$$

The base current $I_{B101}$, of the transistor TR101 is expressed as the sum of the bias (dc) component $I_{B101}$ and the signal (ac) component $i_{B101}$. Thus, the following equation (2) is established.

$$I_{B101}=I_{BB101}+I_{B101} \tag{2}$$

FIG. 2 shows the $I_{BE101}$–$V_{BE101}$ characteristic of the transistor TR101 in the first amplifier stage 103, in which the reference character P1 denotes the operating point of the transistor TR101 located on the curve 52 of the $I_{BE101}$–$V_{BE101}$ characteristic. As seen from the equations (1) and (2), the operating point P1 has an abscissa value of $V_{BB}$ and an ordinate value of $I_{BB101}$.

The input voltage $V_{IN}$ (i.e., the base-to-emitter voltage $V_{BE101}$ of the transistor TR101) varies with time as schematically shown by periodic waveforms 51a and 51b in FIG. 2. The waveform 51a having a small magnitude indicates the change of $V_{IN}$ and $V_{BE101}$ at the received strength of the radio wave being in a low level. The waveform 51b having a large magnitude indicates the change of $V_{IN}$ and $V_{BE101}$ at the received strength of the radio wave being in a very high level.

Due to the change of $V_{IN}$ or $V_{BE101}$, the base current $I_{B101}$, of the transistor TR101 varies with time as schematically shown by periodic waveforms 53a and 53b in FIG. 2. The waveform 53a having a small magnitude indicates the change of $I_{B101}$ caused by the waveform 51a of $V_{IN}$ and $V_{BE101}$ having a small magnitude. The waveform 53b having a large magnitude indicates the change of $I_{B101}$, caused by the waveform 51b of $V_{IN}$ and $V_{BE101}$ having a large magnitude.

As seen from the waveform 53a, when the received strength of the radio wave is low, no problems occur. However, when the received strength of the radio wave is very high, there arises a problem that the waveform 53b has a large distortion. This is because the portion of the waveform 53b above the level $I_{BB101}$ is fully amplified while the portion of the waveform 53b below the level $I_{BB101}$ is not fully amplified, which is due to the shape of the $I_{BE101}$–$V_{BE101}$ characteristic curve 52.

The state shown by the waveform 53b is equivalent to the state that the dc component or average of the base current $I_{B101}$ is raised from its original value $I_{B101}$ to an unwanted value $I_{B101}$, where $I_{B101}<I_{B101}'$. Thus, the dc component or average of the collector current $I_{C101}$, of the transistor TR101 is increased, resulting in the operating point P2 shown in FIG. 3 being shifted to the point P2'.

FIG. 3 shows the $I_{C101}$–$V_{C101}$ characteristic of the transistor TR101 in the first amplifier stage 103, in which the reference number 60 denotes the load line of the transistor TR101. The curve 63 denotes the $I_{C101}$–$V_{CE101}$, characteristic at $I_{B101}=I_{BB101}$ (i.e., at the operating point P1 in FIG. 2). The curve 64 denotes the $I_{C101}$–$V_{CE101}$ characteristic at $I_{B101}=I_{BB101}'$.

Because of the above-described unwanted increase of the dc component value of the collector current $I_{C101}$ of the transistor TR101, the operating point P2 of the transistor TR101 located on the curve 63 is shifted to the unwanted point P2' located on the curve 64 The unwanted point P2' is located within the saturation reaction 62 of the operation of the transistor TR101.

The dc component value of the collector current $I_{C101}$ is very large at the unwanted point P2' and therefore, the voltage drop caused by the load resistor R101 is very large. The large voltage drop thus caused decreases the dc component value of collector-to-emitter voltage $V_{CE101}$ of the transistor TR101 (i.e., the dc component value of the output voltage $V_1$ of the first amplifier stage 103). Since the output voltage $V_1$ is equal to the base-to-emitter voltage $V_{BE102}$ of the transistor TR102 in the second amplifier stage 104, the dc component value of the base-to-emitter voltage $V_{BE102}$ is largely lowered from its wanted value.

As a result, as shown in FIG. 4 indicating the relationship between the base-to-emitter voltage $V_{BE102}$ and the base current $I_{B102}$ of the transistor TR102, the dc component value of the base-to-emitter voltage $V_{BE102}$ is much smaller than its wanted value, in other words, the operating point of the transistor TR102 is displaced from the $I_{BE102}$–$V_{BE102}$ curve 55. This means that the transistor TR102 is unable to perform its amplification operation and that the telephone in FIG. 1 is unable to perform its reception operation in spite of the strength of the received radio wave being sufficiently high. In FIG. 4, the reference numeral 54 denotes the waveform of the base-to-emitter voltage $V_{BE102}$, i.e., the output voltage $V_1$ of the first amplifier stage 103.

For example, due to the operating-point shift from P2 to P2' in FIG. 3, the dc or bias component of the collector-to-emitter voltage $V_{CE101}$ of the transistor TR101 (i.e., the output voltage $V_1$ of the first amplifier stage 103) is lowered abruptly from 0.8 V to 0.2 V, while the supply voltage $V_{CC}$ is equal to 1 V. As known well, generally, the transistor TR102 starts its amplification operation when the base-to-emitter voltage $V_{BE102}$ is approximately 0.6 V. Thus, in this case, the transistor TR102 is unable to amplify the applied voltage $V_1$, in other words, no signal is transmitted from the first stage 103 to the second stage 104.

As explained above, the prior-art transistor amplifier circuit 100 shown in FIG. 1 has a problem that there is a possibility that the telephone is unable to perform its reception operation in spite of the magnitude of the received radio wave being high. This problem can be solved or suppressed by raising the supply voltage $V_{CC}$. However, the supply voltage increase is not preferred in the communication systems such as portable telephones from the viewpoint that the power consumption should be as low as possible.

SUMMARY OF THE INVENTION

Accordingly, an object of the present invention to provide a transistor circuit that ensures signal transmission between adjoining direct-coupled stages at a low supply voltage even when an input signal is in a high level.

Another object of the present invention to provide a transistor circuit that compensates the effect caused by the shift of the operating point of a transistor or transistors due to high-level input.

The above objects together with others not specifically mentioned will become clear to those skilled in the art from the following description.

A transistor circuit according to the present invention is comprised of a first stage having a first transistor and a first load connected to a collector or drain of the first transistor, and a second stage having a second transistor.

An input voltage is applied to a base or gate of the first transistor in the first stage. The first transistor produces a first output current flowing through the first load according to the input voltage, thereby outputting a first output voltage at the collector or drain of the first transistor. The first output voltage from the first stage is applied to a base or gate of the second transistor in the second stage without using any coupling capacitor.

The first load has a variable resistance responsive to a magnitude of a do component of the first output current.

When the magnitude of the dc component of the first output current is increased from a predetermined value due to a magnitude increase of the input voltage, thereby decreasing a magnitude of a dc component of the first output voltage, the variable resistance of the first load is decreased so as to compensate the decreased magnitude of the dc component of the first output voltage.

With the transistor circuit according to the present invention, the first load has a variable resistance responsive to the magnitude of the dc component of the first output current. When the magnitude of the dc component of the first output current is increased from the predetermined value due to a magnitude increase of the input voltage, thereby decreasing the magnitude of the dc component of the first output voltage, the variable resistance of the first load is decreased so as to compensate the decreased magnitude of the dc component of the first output voltage.

Therefore, even if the magnitude of the dc component of the first output voltage in the first stage is decreased (i.e., the operating point of the first transistor is shifted) due to a large magnitude of the input voltage at a low supply voltage, the dc component of the first output voltage can be made to have an enough value for the operation of the second transistor in the second stage. Thus, the second transistor in the second stage is capable of its operation with the applied first output voltage from the first stage even when a large amplitude signal is inputted into the first stage.

As a result, signal transmission between the direct-coupled first and second stages is ensured at a low supply voltage even when an input signal is in a high level. In other words, the effect caused by the shift of the operating point of the first transistor due to high-level input is compensated.

In a preferred embodiment of the transistor circuit according to the present invention, the first load includes a first load resistor, a second load resistor, and a first diode. The first load resistor is connected to the collector or drain of the first transistor. The second load resistor and the first diode are connected in series. The load resistor and the first diode are connected in parallel to the first load resistor. A forward direction of the first diode and a direction of the first output current are same.

In this embodiment, there arises an additional advantage that the first load having the variable resistance responsive to the magnitude of the dc component of the first output current can be realized by a simple and low-cost configuration.

In this embodiment, it is preferred that the first diode is turned on when the magnitude of the dc component of the first output current is greater than a specific value, allowing a part of the first output current to flow through the second load resistor. In this case, there is an additional advantage that the current path for the second load resistor can be automatically turned on or off by simply setting in advance the specific value of the first diode.

As the first diode, a typical junction diode or Zener diode may be preferably used.

In another preferred embodiment of the transistor circuit according to the present invention, the second transistor has a second load connected to a collector or drain of the second transistor. The second transistor produces a second output current flowing through the second load according to the first output voltage from the first stage, thereby outputting a second output voltage at the collector or drain of the second transistor. The second load has a variable resistance responsive to a magnitude of a dc component of the second output current.

In this embodiment, there arises an additional advantage that signal transmission between the second stage and a third stage directly-coupled with the second stage is ensured at a low supply voltage even when a large amplitude signal is inputted into the second stage.

In still another preferred embodiment of the transistor circuit according to the present invention, each of the first and second transistors is a bipolar transistor having a common-emitter configuration. In this embodiment, there arises an additional advantage that the advantage of the present invention is effectively exhibited.

In the transistor circuit according to the present invention, each of the first and second transistors may be a MOSFET (Metal-Oxide-Semiconductor Field-Effect Transistor) having a common-source configuration.

Preferably, the first stage has a single-transistor configuration or a differential transistor pair configuration. However, any other configuration may be applied to the first stage if the first and second transistors are used as active elements.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
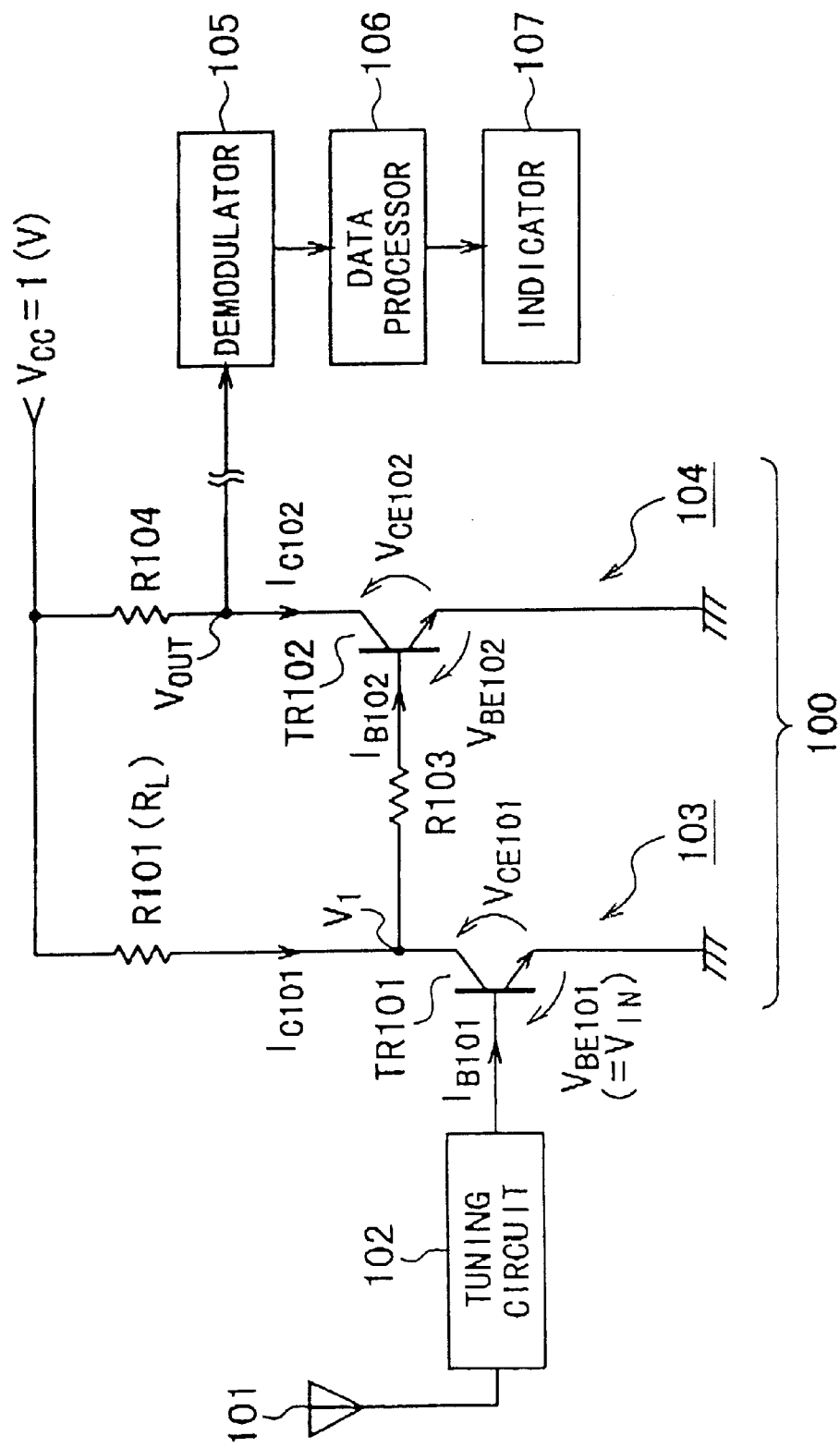
FIG. 1 is a schematic diagram showing the circuit configuration of a prior-art transistor amplifier circuit incorporated into an IC for a mobile telephone.

Preferred embodiments of the present invention will be described in detail below while referring to the drawings attached.

FIRST EMBODIMENT

Figure 5:
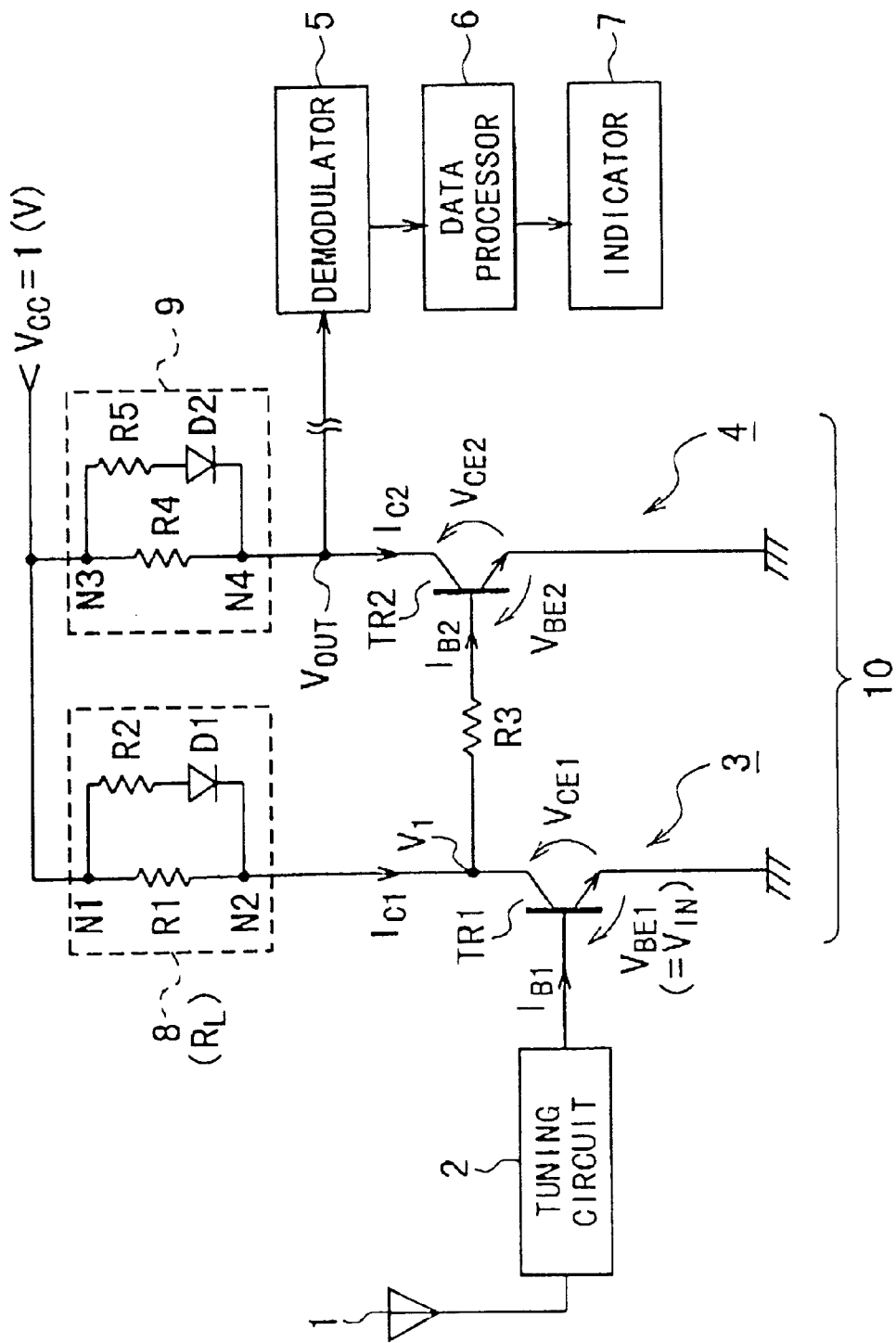
FIG. 5 is a schematic diagram showing the circuit configuration of a transistor amplifier circuit according to a first embodiment of the present invention, which uses bipolar transistors and which is incorporated into an IC for a mobile telephone.

A transistor amplifier circuit according to a first embodiment of the present invention is shown in FIG. 5. This circuit is incorporated into an IC for a mobile telephone. Although this IC has a transmitter circuit, it is omitted in FIG. 5 for simplification of description.

As shown in FIG. 5, the input of the transistor amplifier circuit 10 according to the first embodiment is connected to an antenna 1 through a tuning circuit 2 and the output thereof is connected to a demodulator 5. The output of the demodulator 5 is further connected to the input of a data processor 6. The output of the data processor 6 is connected to the input of a reception indicator 7.

The antenna 1 receives radio wave including transmitted RF signals. The tuning circuit 2 selects a desired one of the RF signals thus received by the antenna 1 and outputs the desired, selected RF signal to the amplifier circuit 10. The RF signal thus inputted into the amplifier circuit 10 is referred as an input voltage $V_{IN}$.

The amplifier circuit 10 amplifies the input voltage $V_{IN}$ and outputs an amplified RF signal to the demodulator 5. The amplified RF signal thus outputted from the amplifier circuit 10 is referred as an output voltage $V_{OUT}$.

The demodulator 5 demodulates the RF signal (i.e., the output voltage $V_{OUT}$) outputted from the amplifier circuit 10 and outputs a demodulated signal to the data processor 6. The data processor 6 performs predetermined data processing operations with respect to the demodulated signal. If the ID No. included in the demodulated signal accords with that of the user or holder, the data processor 6 sends a specific signal to the reception indicator 7, notifying the user of the reception of communications or messages. Thereafter, the user accesses the received communications or messages as necessary.

As seen from FIG. 5, the amplifier circuit 10 has a two amplifier stages 3 and 4 directly-coupled together without using any coupling capacitors.

The first amplifier stage 3 has an npn-type bipolar transistor TR1 whose emitter is connected to the ground and a load 8 (resistance: $R_L$) connected to the collector of the transistor TR1. The input voltage $V_{IN}$ from the tuning circuit 2 is applied to the base of the transistor TR1. The collector of the transistor TR1 is connected through the load 8 to a power supply (not shown) and is applied with a constant supply voltage $V_{CC}$. Here, $V_{CC}$=1 V. An amplified voltage of $V_{IN}$, i e., an output voltage $V_1$ of the first amplifier stage 3, is derived from the collector of the transistor TR1.

Thus, the first amplifier stage 3 has the common-emitter configuration with respect to the transistor TR1.

The load 8 has a load resistor a, a typical junction diode D1, and an additional load resistor R2. The diode D1 and the resistor R2 are connected in series to each other. The serially-connected diode D1 and the resistor R2 are connected in parallel to the load resistor R1 at nodes N1 and N2. The forward orientation of the diode D1 is the same as that of the collector current $I_{C1}$, of the transistor TR1.

The diode D1 serves as a switch for automatically turned on or off the current path for the resistor R2 If the voltage drop caused by the load resistor R1 (i.e. the voltage generated between the nodes N1 and N2) is equal to or less than a specific value, the diode D1 is turned off or open. Therefore, the collector current $I_{C1}$, is unable to flow through the resistor R2. If the voltage drop caused by the load resistor R1 (i.e., the voltage generated between the nodes N1 and N2) is greater than the specific value, the diode D1 is turned on or conducts, allowing a part of the collector current It, to flow through the resistor R2.

For example, the resistance value of the load resistor R1 and the dc component (i.e., the bias current) of the collector current $I_{C1}$, are determined in such a way that the voltage between the nodes N1 and N2 is approximately 0.2 V when the magnitude of the signal (ac) component of the input voltage $V_{IN}$ is zero or small. The junction diode D1 typically has a characteristic allowing a current to flow when an applied voltage is approximately 0.6 V or greater. In other words, the diode D1 has a turn-on voltage of approximately 0.6 V. Therefore, when the magnitude of the signal component of the input voltage $V_{IN}$ is zero or small, no current flows through the resistor R2. This state is the same as that of the first amplifier stage 103 of the prior-art amplifier circuit 100 shown in FIG. 1.

On the other hand, when the magnitude of the signal component of the input voltage $V_{IN}$ is very high, the dc or bias component of the collector current $I_{C1}$, becomes higher than its desired value and accordingly, the voltage between the nodes N1 and N2 becomes higher than the turn-on voltage (approximately 0.6 V) of the diode D1. Thus, the diode D1 is turned on and a part of the collector current $I_{C1}$, flows through the resistor R2. This means that the collector current $I_{C1}$, flowing through the load resistor R1 is decreased, in other words, the resistance of the load 8 is decreased.

As a result, the unwanted increase of the dc component of the collector current $I_{C1}$, is automatically compensated and at the same time, the output voltage $V_1$ (i.e., the base-to-emitter voltage $V_{BE2}$ of the transistor TR2) of the first amplifier stage 3 enters the operable range of the transistor TR2.

The second amplifier stage 4 has the same configuration as that of the first amplifier stage 3. Specifically, the second amplifier stage 4 has an npn-type bipolar transistor TR2 whose emitter is connected to the ground and a load 9 connected to the collector of the transistor TR2. The output voltage $V_1$ from the first amplifier stage 3 is applied to the base of the transistor TR2 through the coupling resistor R3. The collector of the transistor TR2 is connected through the load 9 to the power supply of $V_{CC}$ (=1 V). An amplified voltage of the voltage $V_1$, i.e., the output voltage $V_{OUT}$ of the amplifier circuit 10, is derived from the collector of the transistor TR2.

Thus, the second amplifier stage 4 also has the common-emitter configuration with respect to the transistor TR2.

The load 9 has a load resistor R4, a typical junction diode D2, and an additional load resistor R5. The diode D2 and the resistor R5 are connected in series to each other. The serially-connected diode D2 and the resistor R5 are connected in parallel to the load resistor R4 at nodes N1 and N2. The forward orientation of the diode D2 is the same as that of the collector current $I_{C2}$ of the transistor TR2.

The diode D2 serves as a switch for automatically turned on or off the current path for the resistor R5. Since the operation of the diode D2 is the same as that of the diode D1, the explanation about the diode D2 is omitted here. Also, the operation of the transistor TR2 is the same as that of the transistor TR1 and therefore, no explanation about the transistor TR2 is presented here.

Figure 6:
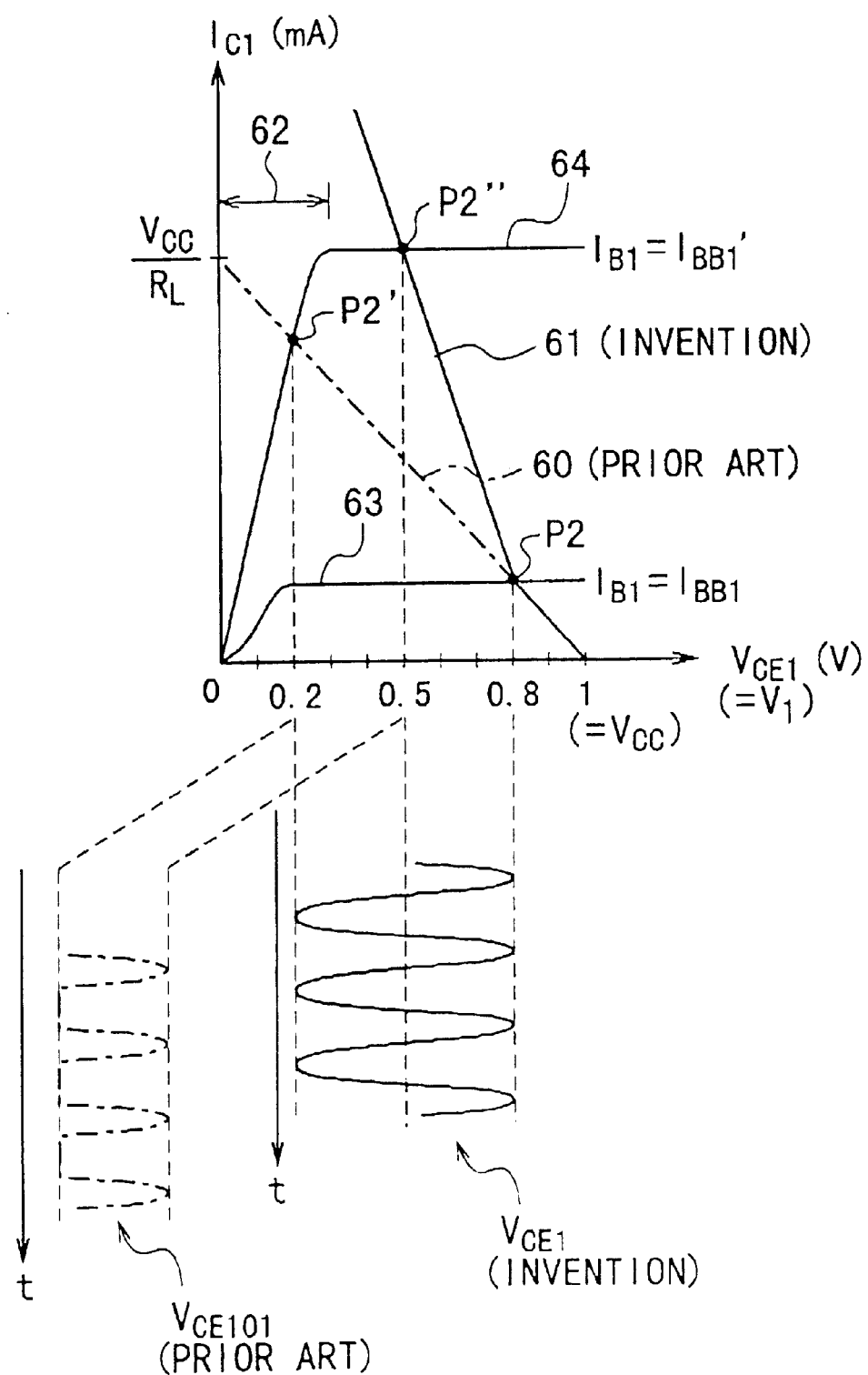
FIG. 6 is a graph showing the relationship between the collector-to-emitter voltage $V_{CE1}$ and the collector current $I_{C1}$, of the bipolar transistor in the first amplifier stage of the transistor amplifier circuit according to the first embodiment of FIG. 5.

FIG. 6 shows the relationship between the collector-to-emitter voltage $V_{CE1}$ and the collector current $I_{C1}$, of the transistor TR1 in the first amplifier stage 3 of the transistor amplifier circuit 10 according to the first embodiment of FIG. 5.

Figure 2:
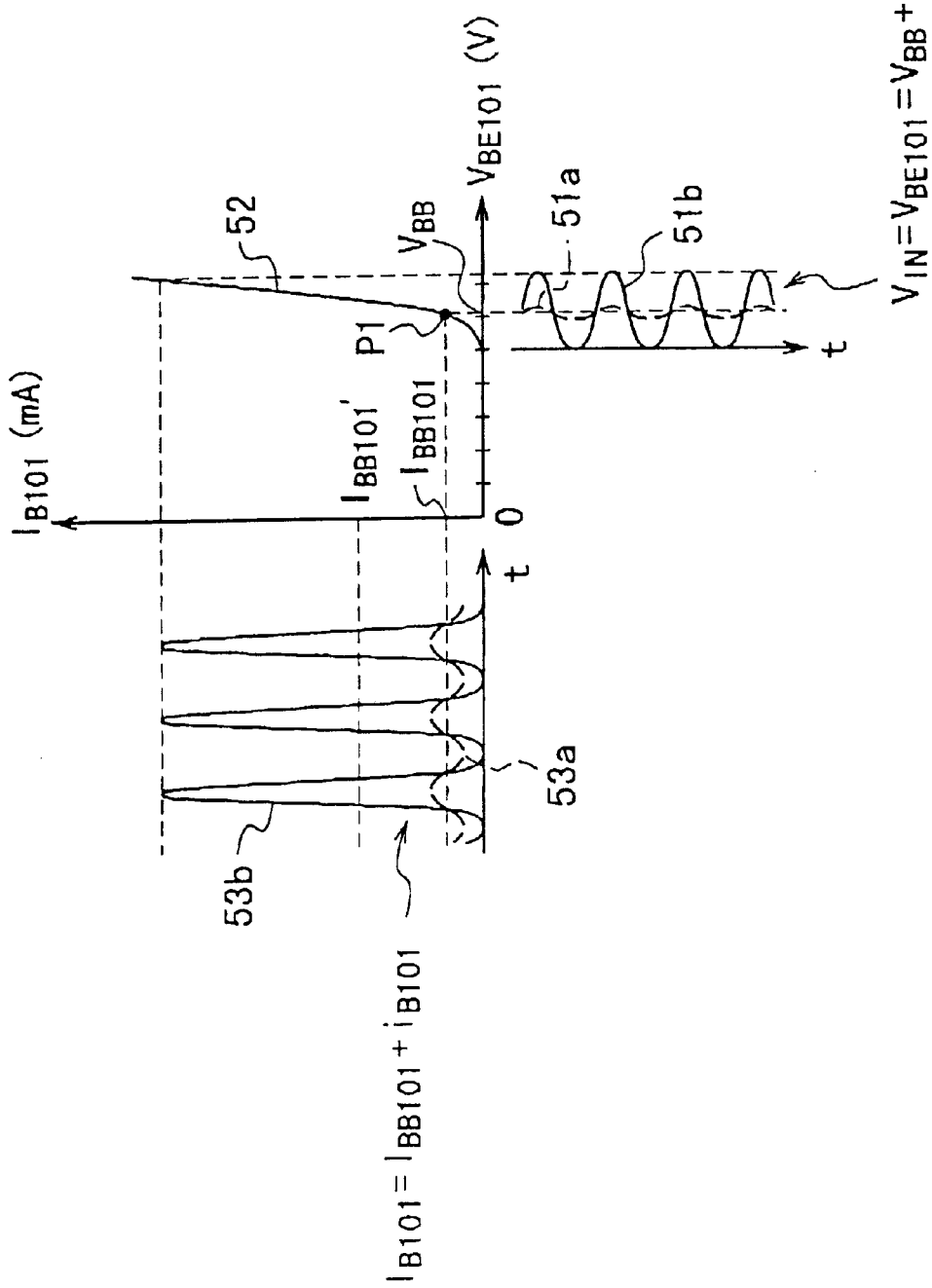
FIG. 2 is a graph showing the relationship between the base-to-emitter voltage $V_{B101}$ and the base current $I_{B101}$ of the bipolar transistor in the first amplifier stage of the prior-art transistor amplifier circuit of FIG. 1.
Figure 3:
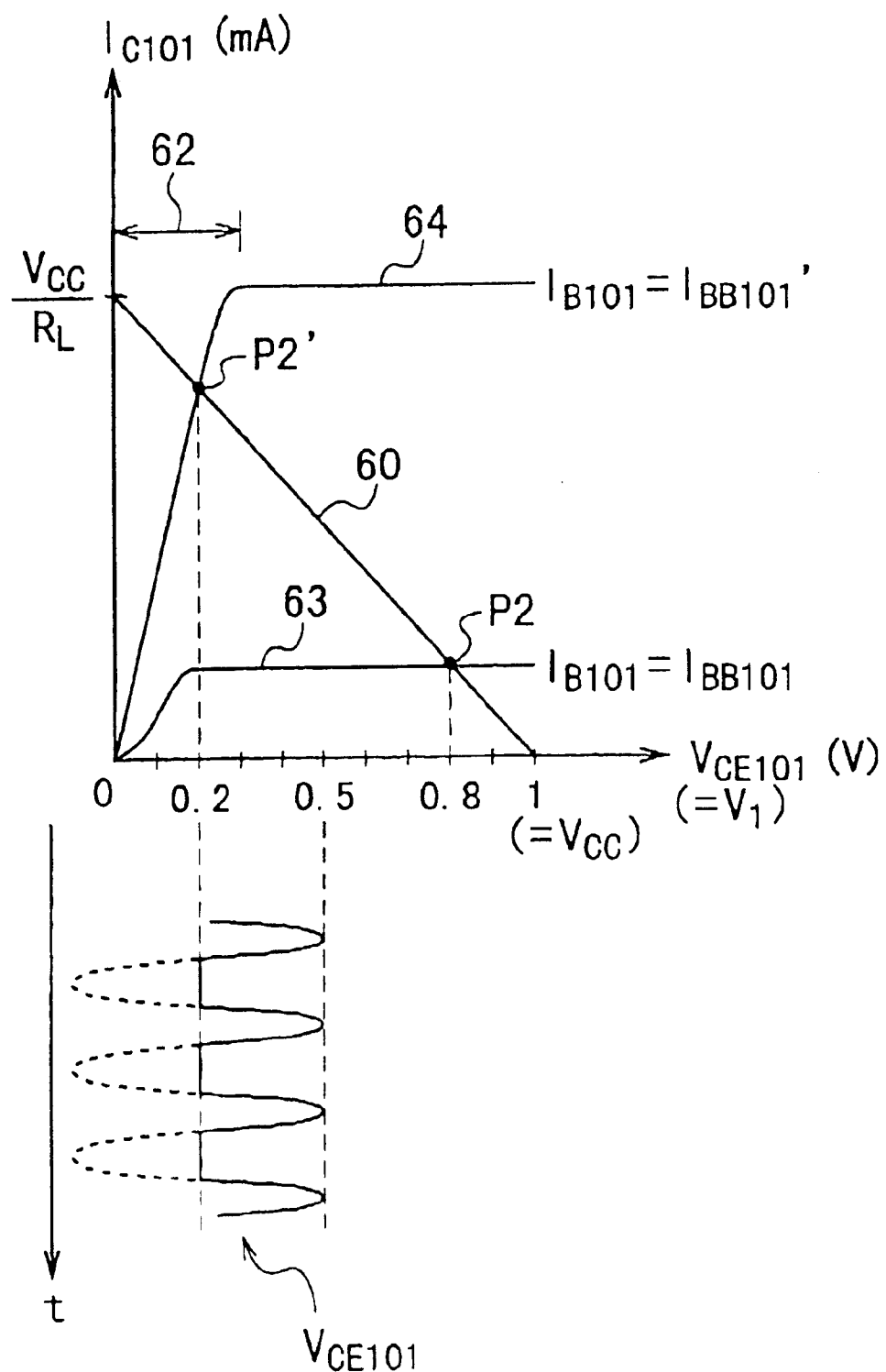
FIG. 3 is a graph showing the relationship between the collector-to-emitter voltage $V_{CE101}$, and the collector current $I_{C101}$, of the bipolar transistor in the first amplifier stage of the prior-art transistor amplifier circuit of FIG. 1.
Figure 4:
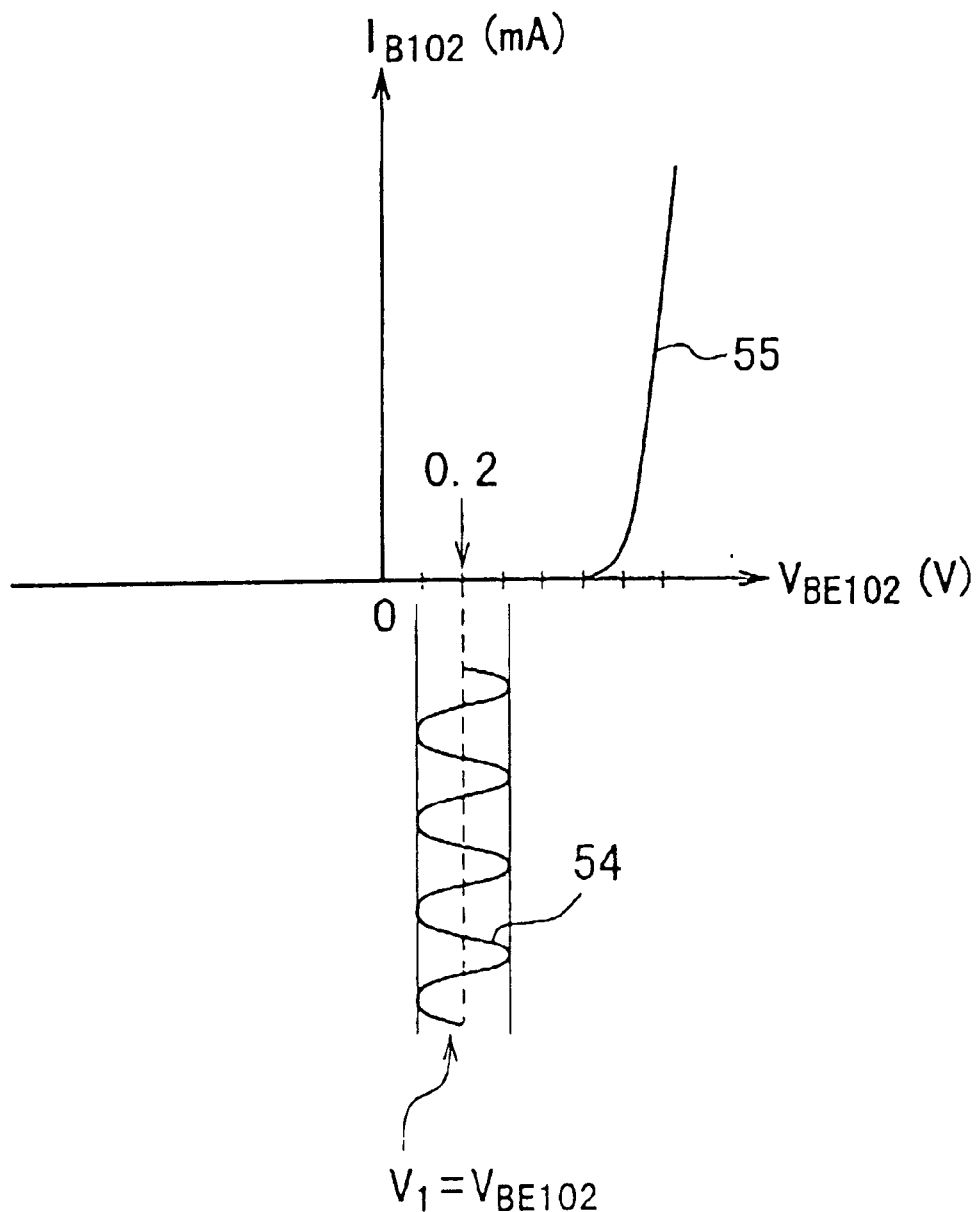
FIG. 4 is a graph showing the relationship between the base-to-emitter voltage $V_{BE102}$ and the base current $I_{B102}$ of the bipolar transistor in the second amplifier stage of the prior-art transistor amplifier circuit of FIG. 1.

As shown in FIG. 6, when the magnitude of the signal component of the input voltage $V_{IN}$ is zero or small, the operating point of the transistor TR1 is located on the point P2 ($V_{CE1}$=0.8 V), which is located at the intersection of the curve of $I_{B1}=I_{BB1}$ and the straight load line 60. At this time, the operating point of the transistor TR1 is located on he same point as indicted by P1 in FIG. 2.

When the magnitude of the signal component of the input voltage $V_{IN}$ is very high, the dc or bias component of the collector current $I_{C1}$ of the transistor TR1 becomes higher than its desired value and accordingly, the voltage between the nodes N1 and N2 becomes higher than the turn-on voltage (approximately 0.6 V) of the diode D1. Then, the diode D1 is turned on and a part of the collector current $I_{C1}$, flows through the resistor R2. This means that the collector current $I_{C1}$ flowing through the load resistor R1 is decreased, in other words, the resistance of the load 8 is decreased. Thus, the slope of the load line 60 is increased at the point P2, forming the load line 61 bent at the point P2. As a result, the operating point is shifted to the point P2" which is located at the intersection of the curve of $I_{B1}=I_{BB1}$' and the load line 61.

In the prior-art amplifier 100, as explained previously, when the magnitude of the signal component of the input voltage $V_{IN}$ is very high, the operating point is shifted to P2' which is located at the intersection of the curve of $I_{B1}=I_{BB1}$' and the load line 60.

Figure 7:
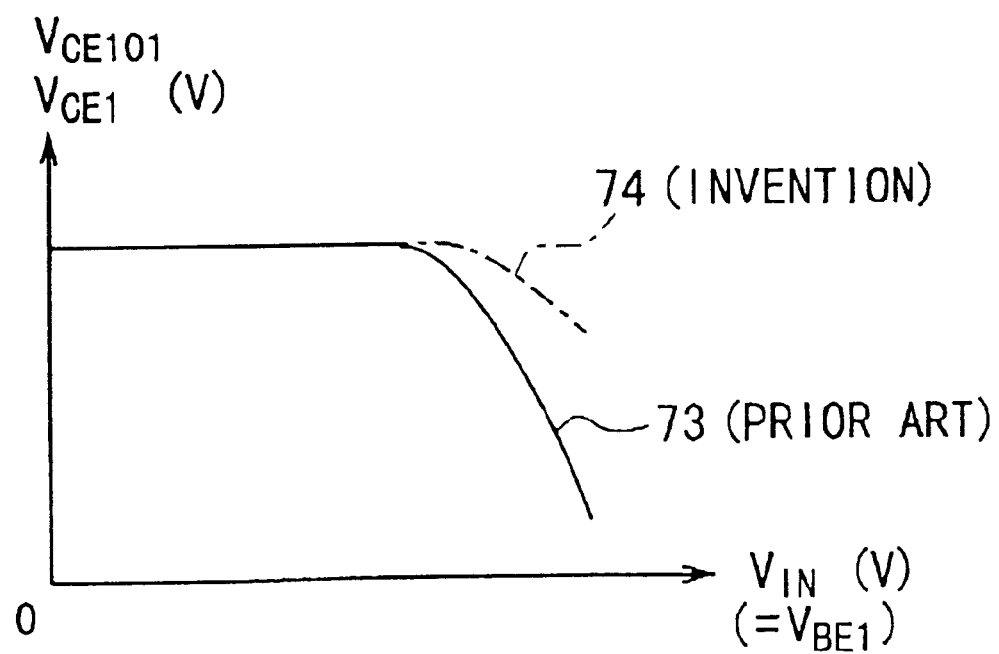
FIG. 7 is a graph showing the relationship between the collector-to-emitter voltage $V_{CE1}$ or $V_{CE101}$ and the input voltage $V_{IN}$ of the first transistor in the first amplifier stage of the transistor amplifier circuit according to the first embodiment of FIG. 5 and that of the prior-art transistor amplifier circuit of FIG. 1.

FIG. 7 shows the relationship (the curve 74) between the input voltage $V_{IN}$ and the collector-to-emitter voltage $V_{CE1}$ in the circuit 10 according to the first embodiment of FIG. 5 and the relationship (the curve 73) between the input voltage $V_{IN}$ and the collector-to-emitter voltage $V_{CE101}$ in the prior-art circuit 100 in FIG. 1.

As seen from the curves 73 and 74 in FIG. 7, when the magnitude of the signal component of the input voltage $V_{IN}$ is in a high level, the lowering of the voltage $V_{CE1}$ of the transistor TR1 in the first embodiment is suppressed or compensated compared with that of the voltage $V_{CE101}$ of the transistor TR101 in the prior-art amplifier 100.

As describe above, with the two-stage amplifier circuit 10 according to the first embodiment of FIG. 5, even if he magnitude of the dc component of the output voltage V1 of the first amplifier stage 3 is decreased due to a large magnitude of the input voltage $V_{IN}$ at a low supply voltage of 1 V, the dc component of the output voltage V1 can be compensated to have an enough value for the amplifier operation of the transistor TR2 in the second amplifier stage 4. In other words, the transistor TR2 in the second amplifier stage 4 is capable of its operation with the applied output voltage V1 even when a large amplitude signal is inputted into the first amplifier stage 3.

Thus, signal transmission between the direct-coupled first and second amplifier stages 3 and 4 is ensured at a low supply voltage of 1 V even when a large amplitude signal is inputted.

Additionally, the shift of the operating point from P2 to P2" in FIG. 6 generates a disadvantage that the gain of the first amplifier stage 3 becomes low. However, this disadvantage causes no problem because the operating point shift takes place in the case where the received RF signal has a sufficiently large strength for reception.

The diode D2 and the resistor R5 in the load 9 may be removed, because they have no relationship with the operation of the transistor TR1. However, it is preferred that the diode D2 and the resistor R5 are provided in the load 9. The reason is that the diode D2 and the resistor R5 will produce the same advantages as explained above with respect to the transistor TR1 for the transistor TR2.

SECOND EMBODIMENT

Figure 8:
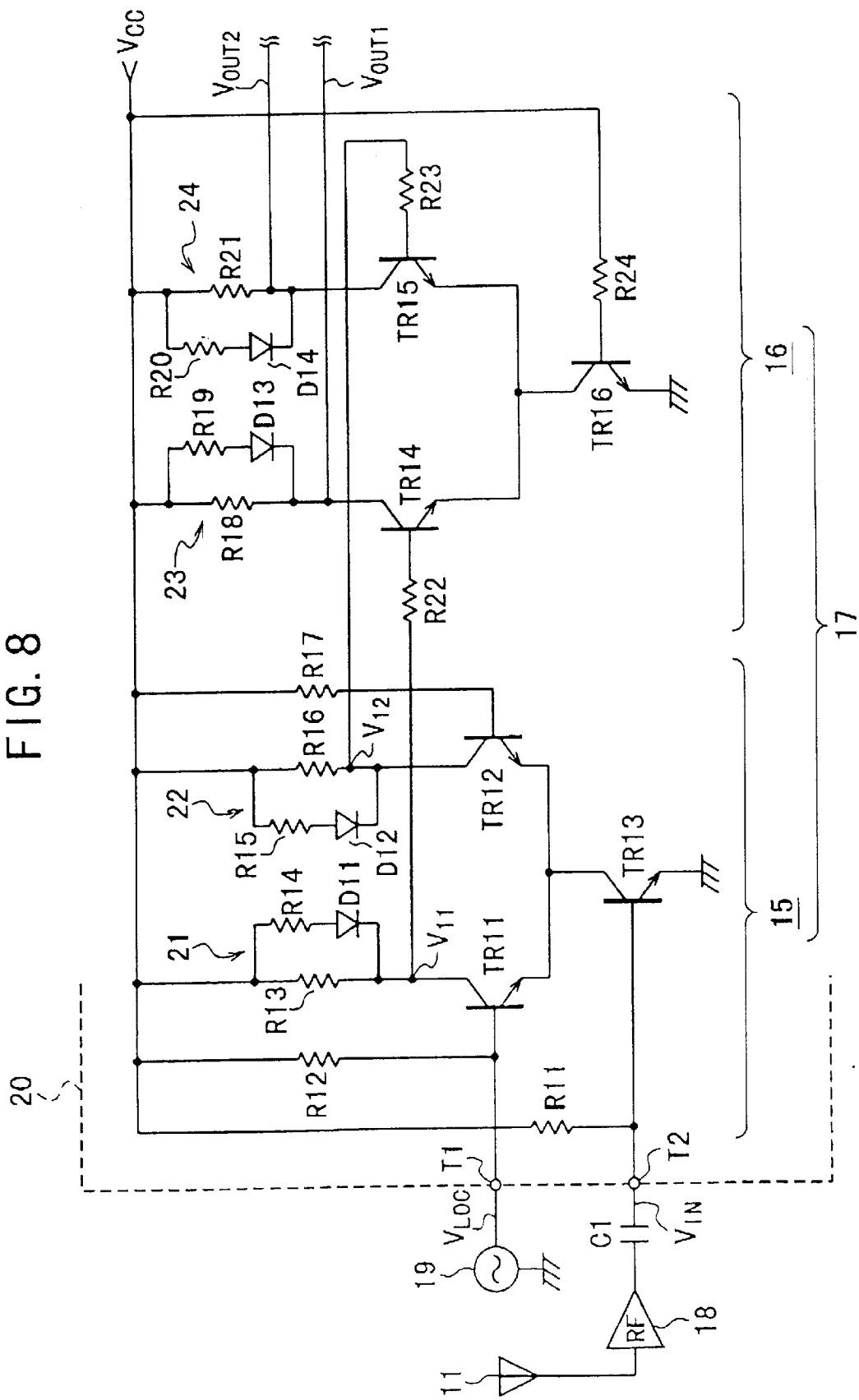
FIG. 8 is a circuit diagram showing the circuit configuration of a transistor circuit according to a second embodiment of the present invention, which is incorporated into an IC for a mobile telephone.

FIG. 8 shows the circuit configuration of a transistor circuit according to a second embodiment of the present invention, which is incorporated into an IC for a mobile telephone.

In FIG. 8, the first and second inputs of the transistor circuit 17 according to the second embodiment are connected to terminals T1 and T2 of the IC 20, respectively. A local oscillator 19, which is provided outside the IC 20, is connected to the terminal T1. Therefore, a local signal voltage $V_{LOC}$ outputted from the local oscillator 19 is applied to the terminal T1. An antenna 11 is connected to the terminal T2 through a RF amplifier 18 and a coupling capacitor C1. The antenna 11, the RF amplifier 18, and the coupling capacitor C1 are provided outside the IC 20. An RF signal received by the antenna 11 is amplified by the amplifier 18. Due to the coupling capacitor C1, only the signal (ac) component of the amplified RF signal is applied to the terminal T2.

The transistor circuit 17 has a single-balance frequency mixer (frequency converter) located in a frequency mixer stage 15 and a differential amplifier located in an amplifier stage 16.

The frequency mixer in the stage 15 is comprised of a pair of npn-type bipolar transistors TR11 and TR12 whose emitters are coupled together and an npn-type bipolar transistor TR13 whose collector is connected to the coupled emitters of the transistors TR11 and TR12. The emitter of the transistor TR13 is connected to the ground.

The base of the transistor TR11 is connected to the terminal T1 and applied with the local signal voltage $V_{LOC}$. The base of the transistor TR11 is further connected through a resistor R12 to a power supply (not shown) and applied with a constant supply voltage $V_{CC}$. The base of the transistor TR12 is connected to the power supply of $V_{CC}$ through a resistor R1. The base of the transistor TR13 is connected to the terminal T2 and applied with the RF signal voltage $V_{IN}$ received by the antenna 11 The base of the transistor TR13 is further connected to the power supply of $V_{CC}$ through a resistor R11.

The collector of the transistor TR11 is connected to the power supply of $V_{CC}$ through a load 21. The load 21 has a load resistor R13, a typical junction diode D11, and an additional load resistor R14. The diode D13 and the resistor R14 are connected in series to each other. The serially-connected diode D11 and the resistor R14 are connected in parallel to the load resistor R13. The forward orientation of the diode D11 is the same as that of the collector current of the transistor TR11.

Like the first embodiment, the diode D11 serves as a switch. If the voltage drop caused by the load resistor R13 is equal to or less than a specific value, the diode D11 is turned off or open. Therefore, the collector current is unable to flow through the additional load resistor R14. If the voltage drop caused by the load resistor R13 is greater than the specific value, the diode D11 is turned on or conducts, allowing a part of the collector current to flow through the resistor R14. Thus, the two parallel-connected resistors R13 and R14 serves as the load of the transistor TR11, which means that the resistance of the load 21 is lowered.

The collector of the transistor TR12 is connected to the power supply of $V_{CC}$ through a load 22. The load 22 has a load resistor R16, a typical junction diode D12, aid an additional load resistor R17. The diode D12 and the resistor R17 are connected in series to each other. The serially-connected diode D12 and the resistor R17 are connected in parallel to the load resistor R16. The forward orientation of the diode D12 is the same as that of the collector current of the transistor TR12.

The operation of the load resistors R16 and 17 and the junction diode D12 in the load 22 is the same as that of the load 21.

The amplifier stage 16 is comprised of a pair of npn-type bipolar transistors TR14 and TR15 whose emitters are coupled together and an npn-type bipolar transistor TR16 whose collector is connected to the coupled emitters of the transistors TR14 and TR15. The emitter of the transistor TR16 is connected to the ground.

The base of the transistor TR14 is connected through a coupling resistor R22 to the collector of the transistor TR11 from which an output voltage $V_{11}$ of the frequency mixer in the stage 15 is derived. Therefore, the output voltage $V_{11}$ is applied to the base of the transistor TR14. The base of the transistor TR15 is connected through a coupling resistor R23 to the collector of the transistor TR12 from which another output voltage $V_{12}$ of the frequency mixer in the stage 15 is derived. Therefore, the output voltage $V_{12}$ is applied to the base of the transistor TR15. The base of the transistor TR16 is connected through a resistor R24 to the power supply of $V_{CC}$.

The collector of the transistor TR14 is connected to the power supply of $V_{CC}$ through a load 23. The load 23 has a load resistor R18, a typical junction diode D13, and an additional load resistor R19 The diode D13 and the resistor R19 are connected in series to each other. The serially-connected diode D13 and the resistor R19 are connected in parallel to the load resistor R18 The forward orientation of the diode D13 is the same as that of the collector current of the transistor TR14.

The collector of the transistor TR15 is connected to the power supply of $V_{CC}$ through a load 24. The load 24 has a load resistor R21, a typical junction diode D14, and an additional load resistor R20. The diode D14 and the resistor R20 are connected in series to each other. The serially-connected diode D14 and the resistor R20 are connected in parallel to the load resistor R21. The forward orientation of the diode D14 is the same as that of the collector current of the transistor TR15.

An output voltage $V_{OUT1}$ of the differential amplifier stage 16 is derived from the collector of the transistor TR14. Another output voltage $V_{OUT2}$ of the differential amplifier stage 16 is derived from the collector of the transistor TR15. These two output voltages $V_{OUT1}$ and $V_{OUT2}$ thus derived are applied to a next stage (not shown).

Since the operation of the frequency mixer in the stage 15 and the differential amplifier in the stage 16 is popular and known well, no explanation about the operation is presented here.

With the two-stage transistor circuit 17 according to the second embodiment shown in FIG. 8, because of the same reason as explained in the amplifier circuit 10 according to the first embodiment, signal transmission between the direct-coupled frequency mixer stage 15 and the differential amplifier stage 16 is ensured at a low supply voltage of 1 V even when a large amplitude signal ($V_{IN}$) is inputted.

THIRD EMBODIMENT

Figure 9:
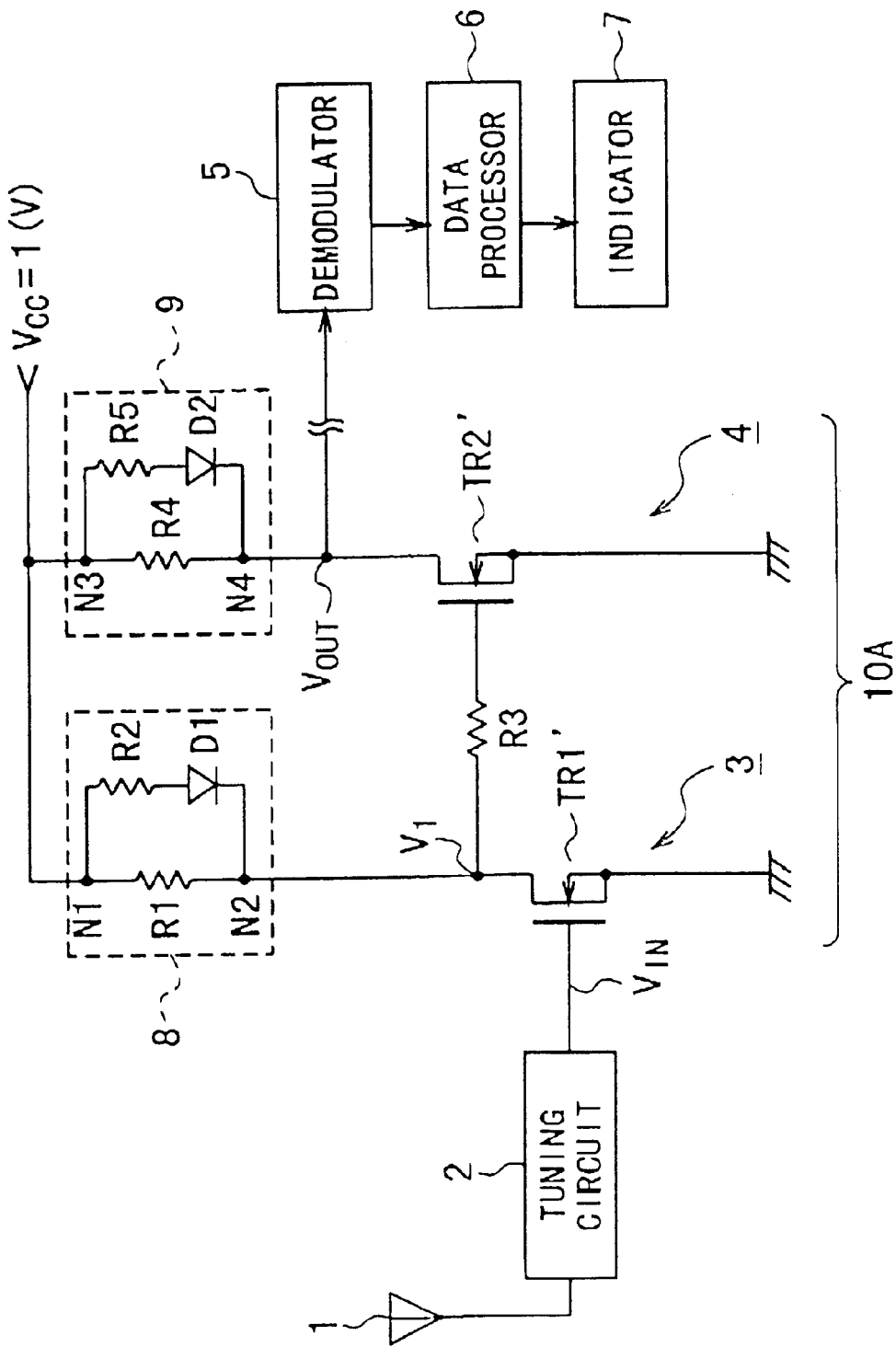
FIG. 9 is a schematic diagram showing the circuit configuration of a transistor amplifier circuit according to a third embodiment of the present invention, which uses MOSFETs and which is incorporated into an IC for a mobile telephone.

FIG. 9 shows the circuit configuration of a two-stage amplifier circuit 10A according to a third embodiment of the present invention. This circuit 10A has a configuration obtained by replacing the npn-type bipolar transistors TR1 and TR2 in FIG. 5 with n-channel MOSFETs TR1' and TR2', respectively. The other configuration of the circuit 10A is the same as that of the circuit 10 according to the first embodiment Therefore, the explanation about the circuit 10A is omitted here.

It is obvious that the circuit 10A has the same advantages as those in the first embodiment.

FOURTH EMBODIMENT

Figure 10:
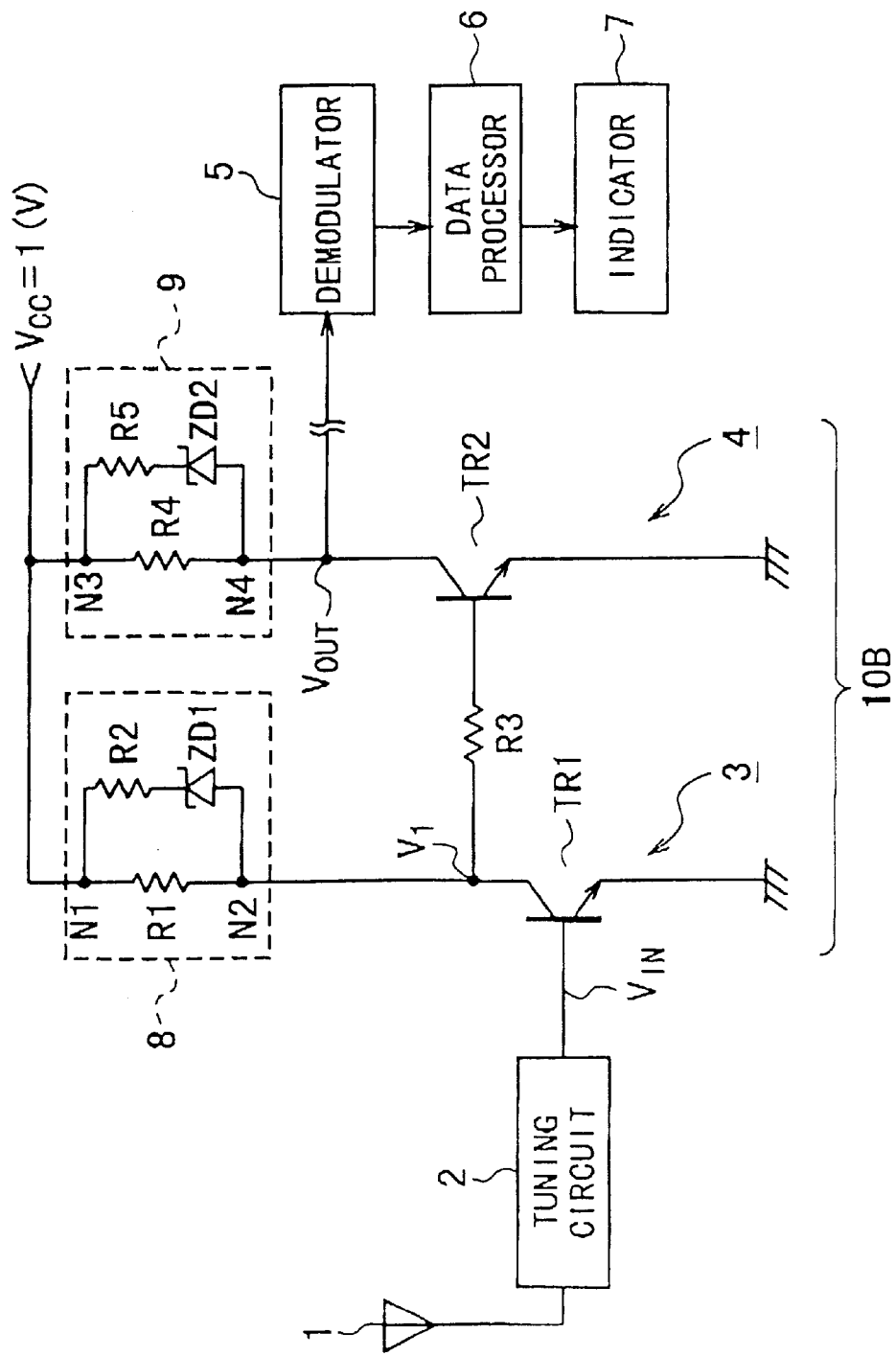
FIG. 10 is a schematic diagram showing the circuit configuration of a transistor amplifier circuit according to a fourth embodiment of the present invention, which uses bipolar transistors and which is incorporated into an IC for a mobile telephone.

FIG. 10 shows the circuit configuration of a two-stage amplifier circuit 10B according to a fourth embodiment of the present invention. This circuit 10B has a configuration obtained by replacing the typical junction diodes D1 and D2 in FIG. 5 with Zener diodes ZD1 and ZD2, respectively. The other configuration of the circuit 10B is the same as that of the circuit 10 according to the first embodiment. Therefore, the explanation about the circuit 10B is omitted here.

As seen from FIG. 10, the forward orientation of the diode ZD1 and ZD2 is opposite to that of the collector currents of the transistors TR1 and TR2.

It is obvious that the circuit 10A has the same advantages as those in the first embodiment.

VARIATIONS

Although the present invention is applied to an amplifier circuit and a frequency mixer circuit in the first to fourth embodiments, it is needless to say that the present invention may be applied to any other circuit.

Moreover, it is needless to say that one or more combination(s) of at least one diode and at least one additional resistor may be added to the load resistor R1, R4, R13, R16, R18, or R21.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A transistor circuit comprising:
   a first stage having a first transistor and a first load connected to a collector or drain of said first transistor;
   a second stage having a second transistor,
      wherein said second transistor has a second load connected to a collector or drain of said second transistor;
      and wherein said second transistor produces a second output current flowing through said second load according to said first output voltage from said first stage, thereby outputting a second output voltage at the collector or drain of said second transistor;
   said second load having a variable resistance responsive to a magnitude of a dc component of said second output current;
   an input voltage being applied to a base or gate of said first transistor in said first stage;
   said first transistor producing a first output current flowing through said first load according to said input voltage, thereby outputting a first output voltage at the collector or drain of said first transistor;
   said first output voltage from said first stage being applied to a base or gate of said second transistor in said second stage without using any coupling capacitor; and said first load having a variable resistance responsive to a magnitude of a dc component of said first output current, wherein when the magnitude of said dc component of said first output current is increased from a predetermined value due to a magnitude increase of said input voltage, thereby decreasing a magnitude of dc component of said first output voltage, said variable resistance of said first load is decreased so as to compensate the decreased magnitude of said dc component of said first output voltage.

2. The circuit as claimed in claim 1, wherein said first load includes a first load resistor, a second load resistor, and a first diode;

said first load resistor being connected to the collector or drain of said first transistor;

said second load resistor and said first diode being connected in series;

said load resistor and said first diode being connected 10 in parallel to said first load resistor; and a forward direction of said first diode and a direction of said first output current are same.

3. The circuit as claimed in claim 2, wherein said first diode is turned on when the magnitude of said dc component of said first output current is greater than a specific value, allowing a part of said first output current to flow through said second load resistor.

4. The circuit as claimed in claim 2, wherein said first diode is one of a junction diode and a Zener diode.

5. The circuit as claimed in claim 1, wherein each of said first and second transistors is a bipolar transistor having a common-emitter configuration.

6. The circuit as claimed in claim 1, wherein each of said first and second transistors is a MOSFET having a common-source configuration.

7. The circuit as claimed in claim 1, wherein said first stage has a single-transistor amplifier configuration.

8. A transistor circuit comprising:

a first stage having a first transistor and a first load connected to a collector or drain of said first transistor, wherein said first stage has a differential transistor pair configuration;

a second stage having a second transistor;

an input voltage being applied to a base or gate of said first transistor in said first stage;

said first transistor producing a first output current flowing through said first load according to said input voltage, thereby outputting a first output voltage at the collector or drain of said first transistor;

said first output voltage from said first stage being applied to a base or gate of said second transistor in said second stage without using any coupling capacitor; and said first load having a variable resistance responsive to a magnitude of a dc component of said first output current, wherein when the magnitude of said dc component of said first output current is increased from a predetermined value due to a magnitude increase of said input voltage, thereby decreasing a magnitude of dc component of said first output voltage, said variable resistance of said first load is decreased so as to compensate the decreased magnitude of said dc component of said first output voltage.

9. A transistor circuit comprising:

a first stage having a first transistor and a first load connected to a collector or drain of said first transistor, wherein said first stage has a frequency mixing operation with a differential transistor pair configuration;

a second stage having a second transistor;

an input voltage being applied to a base or gate of said first transistor in said first stage;

said first transistor producing a first output current flowing through said first load according to said input voltage, thereby outputting a first output voltage at the collector or drain of said first transistor;

said first output voltage from said first stage being applied to a base or gate of said second transistor in said second stage without using any coupling capacitor; and said first load having a variable resistance responsive to a magnitude of a dc component of said first output current, wherein when the magnitude of said dc component of said first output current is increased from a predetermined value due to a magnitude increase of said input voltage, thereby decreasing a magnitude of dc component of said first output voltage, said variable resistance of said first load is decreased so as to compensate the decreased magnitude of said dc component of said first output voltage.

10. The circuit as claimed in claim 1, wherein said first and second stages are designed for operation at a low supply voltage of approximately 1 V.

11. The circuit as claimed in claim 8, wherein said first load includes a first load resistor, a second load resistor, ad a first diode;

said first load resistor being connected to the collector or drain of said first transistor;

said second load resistor and said first diode being connected in series;

said load resistor and said first diode being connected 10 in parallel to said first load resistor; and a forward direction of said first diode and a direction of said first output current are same.

12. The circuit as claimed in claim 8, wherein each of said first and second transistors is a bipolar transistor having a common-emitter configuration.

13. The circuit as claimed in claim 8, wherein each of said first and second transistors is a MOSFET having a common-source configuration.

14. The circuit as claimed in claim 8, wherein said first stage has a single-transistor amplifier configuration.

15. The circuit as claimed in claim 8, wherein said first and second stages are designed for operation at a low supply voltage of approximately 1 V.

16. The circuit as claimed in claim 9, wherein said first load includes a first load resistor, a second load resistor, and a first diode;

said first load resistor being connected to the collector or drain of said first transistor;

said second load resistors and said first diode being connected in series;

said load resistor and said first diode being connected 10 in parallel to said first load resistor; and a forward direction of said first diode and a direction of said first output current are same.

17. The circuit as claimed in claim 9, wherein each of said first and second transistors is a bipolar transistor having a common-emitter configuration.

18. The circuit as claimed in claim 9, wherein each of said first and second transistors is a MOSFET having a common-source configuration.

19. The circuit as claimed in claim 9, wherein said first stage has a single-transistor amplifier confirmation.

20. The circuit as claimed in claim 9, wherein said first and second stages are designed for operation at a low supply voltage of approximately 1 V.

* * * * *